(12) United States Patent
Yamada

(10) Patent No.: US 6,241,857 B1
(45) Date of Patent: *Jun. 5, 2001

(54) METHOD OF DEPOSITING FILM AND SPUTTERING APPARATUS

(75) Inventor: Yoshiaki Yamada, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/972,922

(22) Filed: Nov. 18, 1997

(30) Foreign Application Priority Data

Nov. 20, 1996 (JP) .................................... 8-309335

(51) Int. Cl.$^7$ .................................................. C23C 14/34
(52) U.S. Cl. ................................ 204/192.12; 204/298.12; 204/298.13; 204/298.15; 204/298.28
(58) Field of Search .................. 204/298.28, 298.11, 204/298.12, 192.17, 298.14, 298.15, 298.13, 298.23, 298.07, 192.15

(56) References Cited

U.S. PATENT DOCUMENTS

| | | | | |
|---|---|---|---|---|
| 4,426,265 | * | 1/1984 | Brunsch et al. | 204/192.12 |
| 4,664,935 | | 5/1987 | Strahl | 427/38 |
| 5,382,345 | * | 1/1995 | Huang et al. | 204/298.27 |
| 5,441,615 | * | 8/1995 | Mukai et al. | 204/192.12 |
| 5,456,815 | * | 10/1995 | Fukuyo et al. | 204/298.13 |
| 5,650,052 | * | 7/1997 | Edelstein et al. | 204/192.12 |
| 5,656,138 | * | 8/1997 | Scobey et al. | 204/192.12 |
| 5,798,005 | * | 8/1998 | Murata et al. | 148/421 |

FOREIGN PATENT DOCUMENTS

| | | | |
|---|---|---|---|
| 62-70568 | 4/1987 | (JP) | C23C/14/34 |
| 63-162862 | 7/1988 | (JP) | C23C/14/34 |
| 116070 | 5/1989 | (JP) | C23C/14/34 |
| 4-65823 | 3/1992 | (JP) | H01L/21/285 |
| 4311842 | 11/1992 | (JP) | G11B/11/10 |
| 578831 | 3/1993 | (JP) | C23C/14/34 |
| 681145 | 3/1994 | (JP) | C23C/14/35 |
| 6-101037 | 4/1994 | (JP) | C23C/14/46 |

OTHER PUBLICATIONS

"Filling Technology for Contact Holes with a High Aspect Ratio Using Sputtering Without a Collimator" Kiyota et al VLVAC, pp. 225–230, 1994.

* cited by examiner

Primary Examiner—Carol Chaney
Assistant Examiner—Julian A. Mercado
(74) Attorney, Agent, or Firm—Hayes, Soloway, Hennessey, Grossman & Hage, PC

(57) ABSTRACT

A substrate is placed in a sputtering apparatus chamber with a surface oriented substantially perpendicularly to a direction along which most particles are released from a target by sputtering. A line perpendicular to the substrate passing through the center of the substrate passes through the center of the target. Pressure in the chamber is adjusted such that the distance between the centers of the substrate and target is shorter than the mean free path of a molecule of the sputtering gas, and the distance between the center of the substrate and target is longer than a diameter of the substrate. The substrate is rotated around an axis perpendicular to the surface of the substrate.

26 Claims, 4 Drawing Sheets

METHOD OF DEPOSITING FILM AND SPUTTERING APPARATUS

BACKGROUND OF THE INVENTION

1. Field of the Invention

The present invention relates to a method of depositing a film and a sputtering apparatus for depositing a metal film or a metal alloy film (a compound of a metal film) by sputtering.

2. Description of the Related Art

A metal film on a semiconductor substrate used for LSI has mainly been deposited by sputtering. The reason why is that a good quality, uniform metal film low in impurity content can be deposited on the substrate surface at high speed in a stable manner without causing any damages thereto.

In a semiconductor device such as LSI or the like, a through-hole (or contact hole) is formed in an interlayer insulating film on a semiconductor substrate to connect a semiconductor element and wiring. The aspect ratio calculated as a ratio of "the depth of a through-hole/the diameter of a through-hole" has been increasing with the recent trend toward higher integration of LSI's. Therefore, it is difficult to cover, with high accuracy, the inner wall surface of a through-hole with a metal film, if a conventional sputtering technique is employed.

Therefore, a collimated sputtering technique and a long throw sputtering technique have been proposed as methods for improving the covering ability of a metal film formed on the bottom of a through hole in the case of a high aspect ratio. These methods have in common that the ratio of particles proceeding along a direction substantially perpendicular to the surface of a substrate is increased by sputtering. These sputtering methods will below described in a concrete manner.

The collimated sputtering technique is disclosed, for example, in the publication of Unexamined Japanese Patent Application No. Hei 1-116070, in which a target and a substrate are placed in a chamber and a collimating plate having a number of holes is located between the target and the substrate. Only particles proceeding in a direction substantially perpendicular to the substrate among particles, which proceed toward the substrate pass through the collimating plate and the others are caught by the collimating plate.

The long throw sputtering technique is described, for example, in an article authored by T. KIYOTA, et al. entitled "FILLING TECHNOLOGY FOR CONTACT HOLES WITH A HIGH ASPECT RATIO USING SPUTTERING WITHOUT A COLLIMATOR" in VLVAC, PP. 225–230, 1994. FIG. 1 is a typical view showing a sputtering apparatus when a metal film is deposited on a surface of a substrate by a long throw sputtering technique. A substrate holder 29 is placed in a chamber 22 and a semiconductor substrate 28, for example, of 8 inches in diameter is placed on the substrate holder 29. A target 25 is located above the substrate 28 and a cathode electrode 26 is placed in a manner such that the electrode 26 contacts the upper surface of the target 25. The cathode electrode 26 is connected to a direct current electric source 27 located outside the chamber 22. A gas inlet port 24, through which Ar gas is introduced into the chamber 22, is formed at the side wall thereof. A vacuum exhaust port 23, through which a gas within the chamber 22 is discharged, is formed at the bottom wall of the chamber 22.

A diameter of the target 25 is, for example, 300 mm and a distance between the target 25 and substrate 28 is, for example, 300 mm. A magnet (not shown) is placed near the rear side of the target 25 (near the side of the cathode electrode 26) so that a area, from which the most particles are released, is an area of about 150 mm in diameter in the target.

In the thus structured sputtering apparatus, the distance between the target 25 and substrate 28 is made longer than that of a conventional sputtering technique and sputtering is performed in a lower pressure, and thereby, particles can reach the substrate 28 without being scattered by molecules of a spattering gas.

FIGS. 2A and 2B are sectional views showing covering conditions of Ti films, when the Ti films each are formed on the surface of a substrate by a long throw sputtering technique. A silicon oxide film 42 is formed on the substrate 28 and through holes 42a and 42b are formed in the silicon oxide film 42. It should be noted that, the through hole 42a shown in FIG. 2A is formed at the vicinity of the central portion of the substrate 28, and the through hole 42b shown in FIG. 2B is formed at the peripheral portion of the substrate 28. If a Ti film is formed on the inner wall surface of the through holes 42a, 42b and the upper surface of the silicon oxide film 42 using a sputtering apparatus shown in FIG. 1, particles are released throughout the inner space of the through hole 42a in a uniform manner by sputtering. Therefore, as shown FIG. 2A, a uniform Ti film 41 is formed on the inner wall surface (on the side surface and bottom surface) of the through-hole 42a.

On the other hand, in the peripheral portion of the substrate 28, the number of particles released from the peripheral region of the target 25 by sputtering is smaller than that from the central portion of the target 25. Accordingly, in a through hole 42b formed in the oxide silicon film 42, the Ti film formed on the inner wall surface has a larger thickness in a portion nearer the periphery of the substrate 28 than that in a portion nearer the center thereof. In such a manner, even with use of the sputtering apparatus shown in FIG. 1, the Ti film formed on the inner wall surface of a through hole 42b formed at the peripheral portion of the substrate 28 has a non-uniform film thickness thereacross.

A sputtering apparatus is disclosed in the publication of Unexamined Japanese Patent Application No. Sho 63-162862, in which uniformity (step coverage) between a metal film formed on the inner wall surface of a through hole formed in an interlayer insulating film at the peripheral portion of a substrate and a metal film formed on the surface of the interlayer insulating film is improved. With the sputtering apparatus, a method in which either a target or a substrate is inclined, slid or rotated, or in combination, is employable to form a metal film on the inner wall surface of a through hole in a uniform manner.

A method or an apparatus to form a metal film on a substrate, in which either a target or a substrate is placed in an inclined condition relative to each other, is described in the publications of Unexamined Japanese Patent Application No. Sho 62-70568, Unexamined Japanese Patent Application No. Hei 4-311842, Unexamined Japanese Patent Application No. Hei 5-78831 and Unexamined Japanese Patent Application No. Hei 6-81145.

A method is disclosed in U.S. Pat. No. 4,664,935, in which sputtering is performed while a substrate is inclined relative to a target at 0 to 45° therebetween and the substrate is rotated in order to improve uniformity in thickness, step coverage and surface form of a metal film formed by sputtering. In this method, the inclination of a substrate relative to a target is adjusted at 10 to 45° therebetween in order to prevent a thicker metal film from being formed on the top portion of a through hole and the through hole from being partly closed (self shadowing).

When a metal film is formed on a surface of a substrate using one of the above mentioned conventional methods or apparatuses, however, there arise the following problems, one of which is that the covering rate of a metal film formed on the bottom surface of the through hole is low, and the other is that the utilization efficiency (or the maximum thickness of a metal film which can be formed with one target) of a target is low.

SUMMARY OF THE INVENTION

A first object of the present invention is to provide a method of depositing a film and a sputtering apparatus, in which a uniform metal film can be formed on the side wall surface and the bottom surface of a through hole having a small width and a large depth, and thereby a highly integrated LSI with fine through holes can be fabricated with ease. A second object of the present invention is to provide a method of depositing a film and a sputtering apparatus, in which the utilization efficiency of a target is increased, performance rate of the sputtering apparatus is increased and productivity is improved with low cost.

A first aspect of the present invention is directed to a method comprising a step of placing a target and a substrate in a chamber. The substrate is placed in such a manner that a surface of the substrate is oriented substantially perpendicularly to a direction along which most particles are released from the target by sputtering and a line perpendicular to the substrate passing through the center of the substrate substantially passes through the center of the target. Then a sputtering gas is introduced into the chamber. Subsequently, particles are made to be released from the target by sputtering condition such that the mean free path of a molecule of the sputtering gas is longer than the distance between the centers of the target and substrate, while the substrate is rotated around an axis perpendicular to the surface of the substrate.

A second aspect of the present invention is directed to a method in which, in the above mentioned step of placing a target and a substrate in a chamber, the surface of the substrate is oriented substantially perpendicularly to a direction along which most particles are released from the target by sputtering. The substrate is placed in such a manner that a line perpendicular to the substrate passing through a first position thereon spaced along a direction, in which the particles the target, from the center of the substrate by a distance of a half radius thereof passes through a second position on the target, which is nearest substrate in an area where substantially most particles are released from the target by sputtering. In a step of releasing sputtering particles from the target, condition are set such that the mean free path of a molecule of the sputtering gas is longer than the distance between the first position on the substrate and the second position on the target. Before this step, a farther side region from the target, which is one of two halves divided by a line down the center, is shielded in the surface of the substrate so that the sputtered particles may not reach the farther side region.

A direction, along which most particles are released out from the target by sputtering, is generally not a direction perpendicular to the surface of the target. For example, the direction along which most particles 45° for a target having a surface plane (100), and 35° for a target having a surface plane (002). In the present invention, the surface of the substrate is oriented substantially perpendicularly to the direction along which the particles are released from the target by sputtering. Also, since the mean free path of a molecule of a sputtering gas is longer than the distance between the centers of the target and substrate, a sputtered particle has a small chance of being scattered by molecules of the sputtering gas, before it can reach the substrate. Accordingly, a metal film can uniformly be deposited on the inner surface of through holes, which is respectively formed in the vicinities of the central and peripheral portions. Besides, in the present invention, since the substrate is rotated around an axis perpendicular to the surface of the substrate during film deposition, the thickness distribution of the metal film on the surface of the substrate becomes uniform.

In another method of depositing a film of the present invention, a step where particles are released from a target by sputtering is performed under conditions such that the mean free path of a molecule of the sputtering gas is longer than the distance between the first position on the surface of the substrate spaced along a direction, in which the particles the target, from the center thereof by a length of a half radius thereof and the second position on the target, which is nearest the substrate in an area where substantially most particles are released therefrom by sputtering. The farther side region from the target, which is one of two halves divided by a line down the center, in a surface of the substrate is shielded so that sputtered particles may not reach the farther side region. Under such conditions, though a metal film is deposited on the unshielded region of the surface of the substrate, the metal film can uniformly be formed across all the surface, since the substrate is rotated during film deposition. Besides, since the apparatus is designed so that a metal film may be formed only to cover a region of one of two halves divided by a line down the center in a stationary state, there is no need for a large diameter target and a metal film can be formed across the surface of a substrate having a larger diameter than that of conventional substrate, achieving a uniform thickness of a film. Therefore, the utilization efficiency of a target can be improved, the operation ratio of the spattering apparatus can also be increased and productivity in fabrication of a semiconductor device can be improved with low cost as well.

DETAILED DESCRIPTION OF THE PREFERRED EMBODIMENTS

Descriptions will below be given on embodiments of the present invention in a concrete manner in reference to the accompanying drawings.

Figure 1:
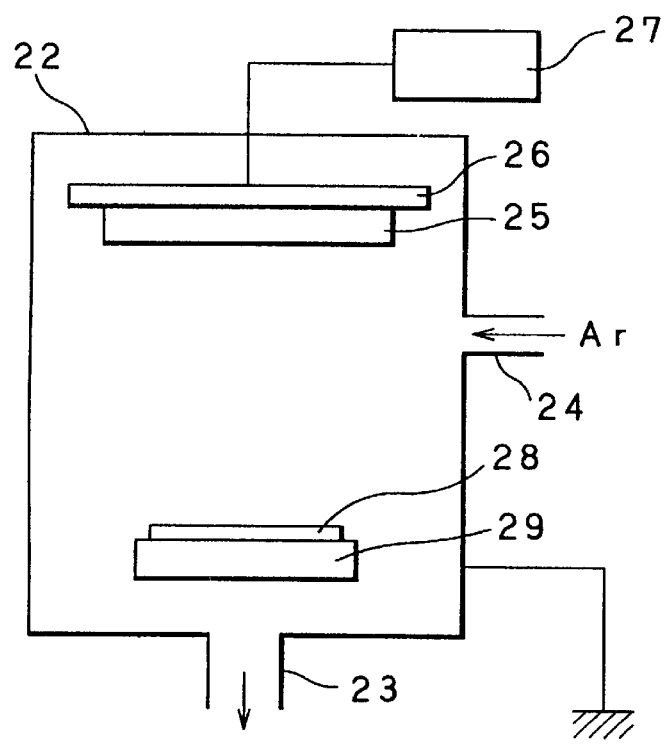
FIG. 1 is a typical view showing a sputtering apparatus when a metal film is deposited on a surface of a substrate by a long throw sputtering technique.
Figure 2A:
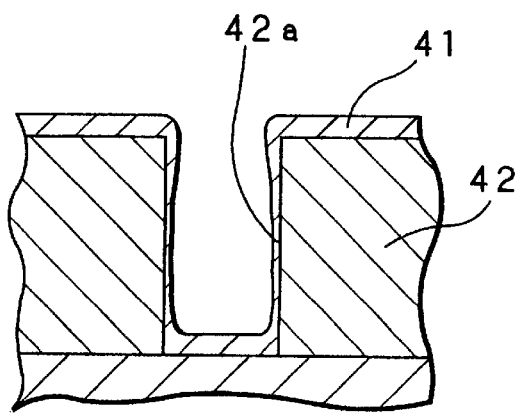
FIGS. 2A and 2B are sectional views showing covering conditions of Ti films, when the Ti films each are formed on the surface of a substrate by a long throw sputtering technique.
Figure 2B:
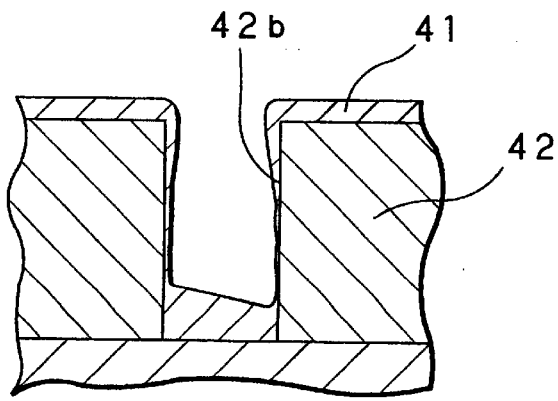
Figure 3:
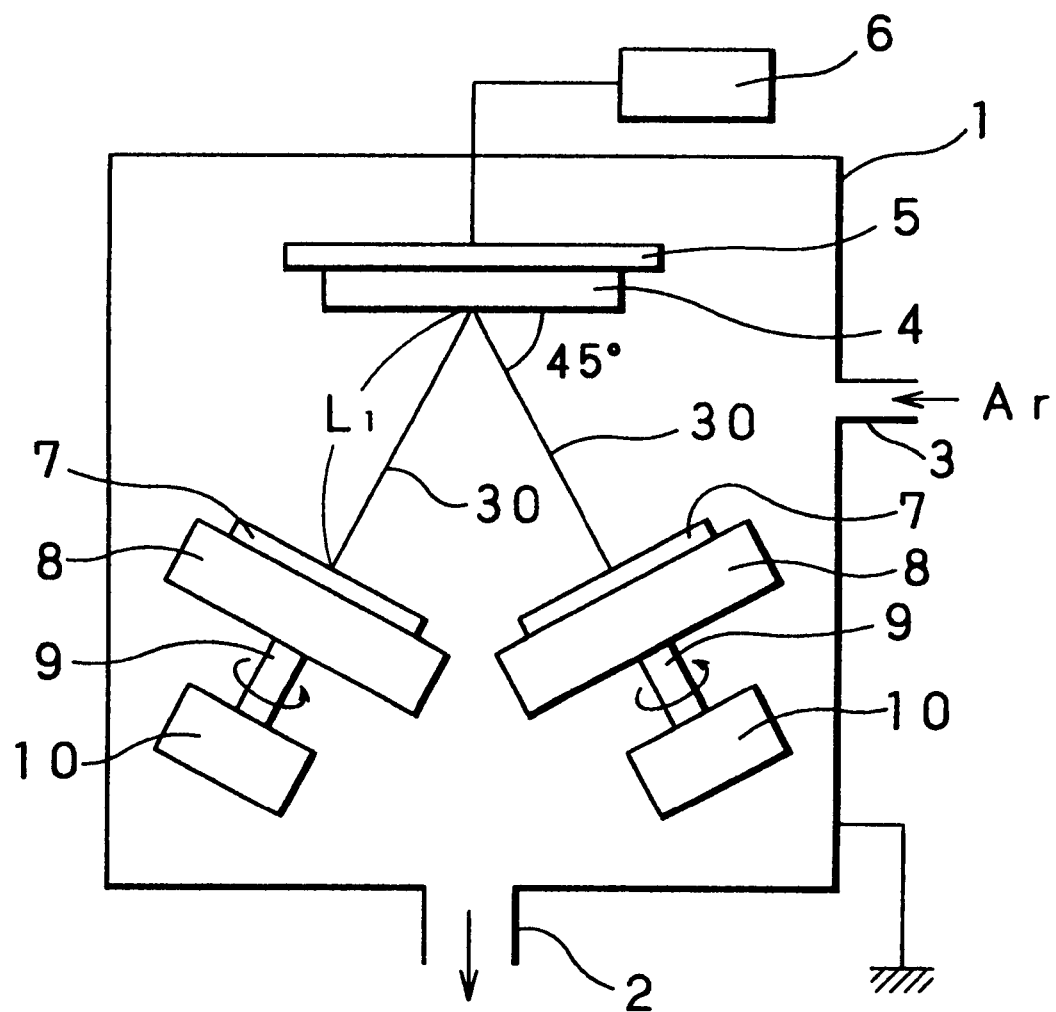
FIG. 3 is a typical view showing a sputtering apparatus according to a first embodiment of the present invention.

FIG. 3 is a typical view showing a sputtering apparatus according to a first embodiment of the present invention. Substrates 7 and substrate holders 8 are placed in a chamber 1. Motors 10 are mounted to the respective substrate holders 8 with interposing rotary shafts 9 therebetween and the substrate holders 8 holding substrate 7 are respectively rotated by drive of the motors 10. In an upper space in the chamber 1, a target 4 and a cathode electrode 5 fixedly holding the target 4 while the electrode contacts the upper surface of the target 4 are placed. The cathode electrode 5 is connected to a direct current electric source 6 located outside the chamber 1. In FIG. 3, while there are shown the two substrates 7, one substrate may be placed in the chamber 1 or the number of substrates placed in the chamber 1 may be three or more in the present invention.

A vacuum exhaust port 2 for evacuating a gas from the chamber is formed at the bottom wall of the chamber 1 and a vacuum pump (not shown) is connected to the vacuum exhaust port 2. Moreover, a gas inlet port 3 to introduce an inert gas such as Ar gas into the chamber 1 is formed at the side wall of the chamber 1. That is to say, pressure in the chamber 1 can be adjusted so as to be kept at a predetermined pressure by introducing an inert gas into the chamber 1 through the gas inlet port 3.

A magnet (not shown) is placed near the rear side of the target 4, that is near the side, which the cathode electrode contacts. The area of target 4 from which the most particles are released by sputtering is determined according to a position of the magnet. Besides, in the embodiment, a surface of a substrate 7 is placed in such a manner that the surface is oriented perpendicularly to a direction along which most particles are released from the target 4 by sputtering. That is, a line 30 passing through the center of the substrate 7 perpendicular thereto (normal to the substrate at the center thereof) passes through the center of the target 4. Also, the distance $L_1$ between the center of the substrate 7 and the center of the target 4 is set not only so as to be shorter than the mean free path of a molecules of the inert gas when pressure in the chamber 1 is adjusted at a predetermined pressure, but also so as to be longer than the diameter of the substrate 7.

Figure 4:
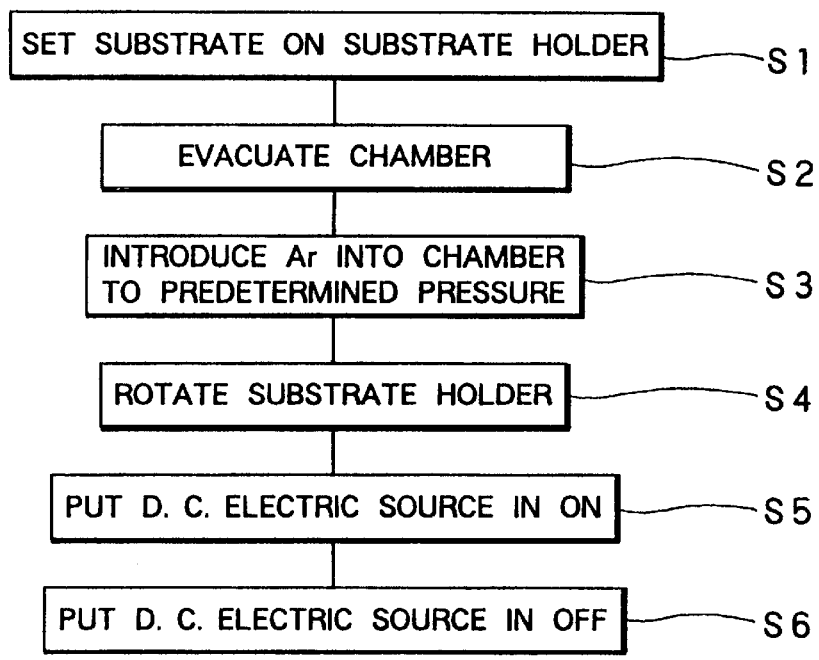
FIG. 4 is a flow chart diagram showing steps in a method of depositing a film according to an embodiment of the present invention.

A method of depositing film using the sputtering apparatus constructed in such a structure will now be described in reference to the flow chart diagram of FIG. 4. As shown in FIG. 4, a substrate 7 is first set on a substrate holder 8 (step S1). On this occasion, the step S1 can be performed, while maintaining a pressure in the chamber 1 at atmospheric pressure. However, if step S1 is performed under atmospheric pressure, a long time is required to evacuate the a gas from the interior of the chamber 1 in next step. Therefore, it is preferable that substrates 7 are set on substrate holders 8 in the chamber 1 under vacuum according to a method described below. That is, a load lock chamber (not shown) is placed near the chamber 1 and after the substrates 7 are placed in the chamber, the chamber is evacuated. Thereafter, the substrates 7 are set in the chamber 1 under vacuum. If the step S1 is performed in such a way, the next step can be simplified.

After setting the substrates 7, the gas is evacuated from the interior of the chamber 1 by drawing a vacuum pump down to a pressure of, for example, $1 \times 10^{-7}$ Torr or less (step S2). If the load lock chamber or the like is employed in the step S1, the substrates 7 are placed in the chamber 1 and a pressure in the chamber 1 is adjusted to $1 \times 10^{-7}$ Torr or less in advance of step S2, the operation in step S2 can be deleted.

Then, an inert gas such as Ar gas is introduced into the chamber 1 through the gas inlet port 3. At this time, an Ar gas flow rate is strictly controlled using a mass flow controller or the like in such a manner that pressure in the chamber 1 is set at a predetermined pressure. The predetermined pressure is a pressure under which the mean free path of an Ar molecule is longer than the distance $L_1$ between the centers of the target 4 and each substrate 7. If necessary, adjustment of the vacuum exhaust port 2 is changed so that pressure in the chamber 1 is set at the predetermined pressure (step S3).

After the pressure in the chamber is set at the predetermined pressure, the substrates holders 8 on which the substrates 7 are respectively set are rotated around respective axes 9 perpendicular to the substrates 7 (step S4). The center of rotation is not necessarily the middle portion of a substrate 7. However, if the center of rotation is spaced apart from the central portion of the substrate 7, a space which the rotation of a substrate 7 covers is broad and it is difficult to place a plurality of substrates 7 in one chamber 1. Accordingly, each substrate 7 and the rotary axis 9 thereof are set preferably in such a manner that the rotary axis 9 is located in the vicinity of the central portion of each substrate 7.

Thereafter, the direct current electric source 6 is switched on and a negative voltage is applied to the cathode electrode 5 to initiate a glow discharge (step S5). Thereby, Ar gas is ionized, ionized gas molecules are accelerated to impinge on the target 4 and a substance of the target 4 is dislodged as particles. Therefore, a metal film is formed on the surface of each substrate 7.

When the metal film is deposited on the surface of each substrate 7 to a desired thickness, the direct current electric source is turned off to stop the glow discharge, so that the film deposition is terminated (step S6). After that, the rotation of the substrate holders 8 are stopped and the substrates 7 on each of which the film deposition is completed are taken out of the chamber 1.

Figure 5A:
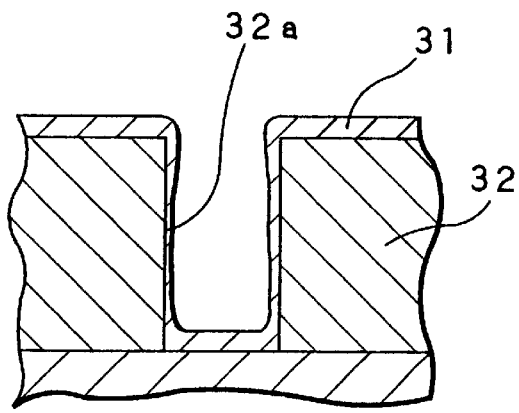
FIGS. 5A and 5B are sectional views showing covering conditions of metal films when they are deposited on the surfaces of substrates by a method of depositing a film according to a first embodiment of the present invention.
Figure 5B:
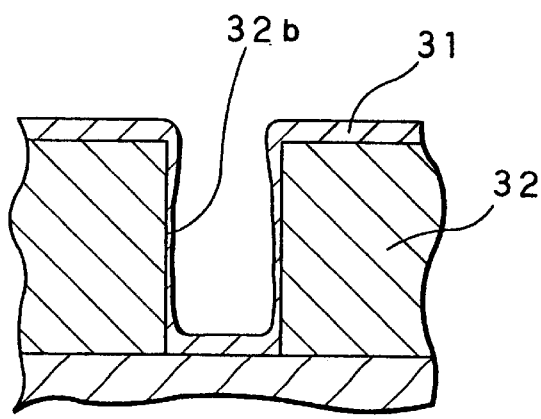

FIGS. 5A and 5B are sectional views showing covering conditions of metal films when they are deposited on the surfaces of substrates by a method of depositing a film according to the first embodiment of the present invention, wherein FIG. 5A shows a covering condition of a metal film on a inner surface of a through hole 32a formed in a silicon oxide film 32 on the substrate 7 in the vicinity of the central portion thereof, and FIG. 5B shows a covering condition of the metal film on a inner surface of a through hole 32b formed in the silicon oxide film 32 on the substrate 7 in the vicinity of the peripheral portion thereof.

In step S5, the direction along which most particles are released by sputtering is generally not perpendicular to the surface of the target 4, but rather is inclined at an angle of 20 to 50° from the surface of the target 4. In a conventional technique, the angle between a target and a substrate has not been optimized. Besides, if sputtering is performed under pressure commonly used in a conventional technique, sputtered particles have many chances to collide with molecules of the inert gas before the particles from the target reach the substrate and thereby change their original directions.

In this embodiment, a surface of a substrate 7 is placed perpendicularly to a direction along which most particles are released from the target 4 by sputtering. Also, pressure in the chamber 1 is adjusted to that to which the mean free path of an Ar molecule is longer than the distance $L_1$ between the centers of the target 4 and substrate 7. Therefore, in the embodiment, a sputtered particle has a smaller chance to be scattered by molecules of a sputtering gas before the particle reaches the substrate 7. In this embodiment, since distance $L_1$ between the centers of the target 4 and substrate 7 is longer than the diameter of the substrate 7, most particles are released in a direction perpendicular to the substrate 7. Accordingly, as shown in FIGS. 5A, 5B, when the silicon oxide film 32 having the through holes 32a and 32b is formed on the surface of the substrate 7, a uniform metal film can be deposited on the bottom surfaces of the through hole 32a located in the vicinity of the central portion of the substrate 7, and the through hole 32b located in the vicinity of the peripheral portion of the substrate 7.

In this embodiment, since the substrate 7 is rotated during deposition of the metal film, the thickness of the metal film across the surface of the substrate 7 is uniform and the step coverage becomes good as well.

Conditions and results when an Al alloy film is actually deposited on the surface of a substrate 7 using the sputtering apparatus shown in FIG. 3 are described in a specific manner. A gas is evacuated from the chamber 1 through the vacuum exhaust port 2 by a vacuum pump and pressure in the chamber 1 is adjusted to a pressure of $10^{-8}$ Torr or lower. In the chamber 1, an Al alloy target 4 having a polycrystal structure substantially oriented so as to have a (100) surface plane is held on the cathode electrode 5. The cathode electrode 5 is connected to the direct current electric source 6 located outside the chamber 1. The diameter of the target is, for example, 300 mm.

In the chamber 1, four sets of substrate holders 8 and motors 10 or the like are placed so that four substrates 7 can simultaneously be set. In FIG. 3, views of two sets of substrate holders 8 and motors 10 respectively used for the other two substrates 7 are omitted. Substrates 7 made of silicon 8 inches in diameter are respectively fixed on the substrate holders 8 by electrostatic adhesion. The substrate holders 8 are respectively held on rotary shafts 9 of the motors 10. Thereby, the substrates 7 each are rotated around a central portion as a center of rotation.

The substrates 7 each are placed in the chamber 1 in such a manner that a line 30 perpendicular to a substrate 7 passing through the center thereof passes approximately through the central portion of the target 4 and the surface of each substrate 7 is relatively inclined from the surface of the target 4 at an angle of about 45°. An gas inlet port 3 for introducing Ar gas into the chamber 1 is formed at the side wall of the chamber 1. Accordingly, pressure in the chamber 1 can be adjusted to a predetermined pressure by introducing Ar gas into the chamber 1 while a gas flow rate is controlled by a mass flow controller.

The distance $L_1$ between the centers of the substrate 7 and target 4 is, for example, 250 mm. At this time, if pressure in the chamber 1 is adjusted to 0.3 mTorr by introducing Ar gas, the mean free path of a molecule of Ar gas is longer than the distance $L_1$ between the centers of the substrate 7 and target 4, since the mean free path is about 300 mm.

A method of depositing an Al alloy film on the surface of the substrate 7 using a sputtering apparatus constructed in such a way will be described in a specific manner. The substrate 7 having a diameter of 8 inches is first set on a substrate holder 8 (step S1). At this time, if a load lock chamber is placed in the vicinity of the chamber 1 and the substrate 7 is set in the chamber 1 by way of the load lock chamber, the substrate 7 can be transported into the chamber 1 without decreasing the vacuum therein. In this case, the time period can be shortened in next step by a time period of evacuation. Thereby, the number of substrate treated per a unit time is increased, and oxidation and contamination of the surface of the target 4 can be prevented.

After four substrates are set on the respective substrate holders 8, the vacuum pump is actuated to evacuate a gas from the chamber 1 to a pressure of $1 \times 10^{-7}$ Torr or less (step S2). In the embodiment, since the substrates 7 are placed into the chamber 1 by way of the load lock chamber in step S1, pressure in the chamber 1 is constantly kept at $1 \times 10^{-7}$ Torr or less. In this case, an operation in step S2 can be omitted. When the load lock chamber is used, since transportation is performed under vacuum, the substrates 7 are generally transported in a state where Ar gas as a sputtering gas is made to flow into the chamber 1. Therefore, since pressure in the chamber 1 is higher than that in the load lock chamber, a impurity gas such as oxygen, nitrogen or the like has a little chance of flowing into the chamber 1 from the load lock chamber. In this case, especially, evacuation of the chamber 1 is not necessary.

Thereafter, an inert gas such as Ar gas or the like is introduced into the chamber 1 through the gas inlet port 3. At this time, in order to lengthen the mean free path of an Ar molecule, sputtering pressure is required to be decreased. That is, a valve of the vacuum exhaust port 2 is fully opened, and Ar gas flow rate is strictly controlled and thereby pressure in the chamber 1 is adjusted to 0.3 mTorr. In such a case, the mean free path comes to be about 300 mm and longer than the distance $L_1$ (250 mm) between the centers of the target 4 and the substrate 7 (step S3).

After the pressure in the chamber is adjusted, each substrate holder 8 on which a substrate 7 is set is rotated around an rotary axis 9 perpendicular to the substrate 7 (step S4). The center of rotation is set in the central portion of the substrate 7. A rotational speed may be in the range of 10 to about 100 revolutions per min and, for example 50 revolutions per min, is employed.

Thereafter, a direct current electric source is switched on and, a negative voltage is applied to the cathode electrode 5 and thereby a glow discharge is initiated (step S5). The power for sputtering is, for example, 20 kW. Under this condition, Ar gas is ionized and accelerated to impinge on the target 4 and to release Al alloy particles from the target 4 made of Al alloy. In this embodiment, since the target 4 is made of Al alloy which is substantially oriented so as to have the surface plane (100) thereof, as shown in FIG. 3, the direction along which most particles are emitted from the target 4 is a direction inclined from the surface of the target 4 at an angle of 45°.

In this embodiment, each substrate 7 is placed so that the surface of each substrate 7 is inclined from the surface of the target 4 at an angle of 45°. A pressure in the chamber 1 is low, the mean free path of Ar gas molecules are lengthened, and particles released from the target 4 each have little chance of being scattered by Ar molecules until the particles reach the surface of each substrate 7. Therefore, many particles are made to impinge on the surface of each substrate 7 in a direction approximately perpendicular to the surface of each substrate 7 by sputtering.

Thereby, as shown in FIGS. 5A and 5B, a uniform metal film can be deposited on the bottom surfaces of the through hole 32a located in the vicinity of the central portion of the substrate 7 and the through hole 32b located in the vicinity of the peripheral portion thereof. Therefore, A uniform deposition of an Al alloy film can be realized even on the inner wall surface of a further finer, deeper through hole, compared with the case where a conventional sputtering apparatus is employed. Besides, since each substrate 7 is rotated, a thickness distribution across the surface of each substrate 7 becomes uniform and the step coverage is improved as well.

After a sputtering for about 90 sec is performed in order to deposit a metal film of 1.0 μm on the surface of each substrate 7, the direct current electric source 6 is turned off to stop the glow discharge, and thereby a film deposition of the Al alloy film is completed. (step S6) Thereafter, rotation of each substrate holder 8 is stopped and then four substrates 7 on each of which a film deposition is completed are taken out of the chamber 1. Subsequently, if Al alloy films are further deposited on the surfaces of other substrates, a process comprising steps from S1 to S6 are repeated.

While in the embodiment, a target 4 substantially oriented so as to have a (100) oriented surface plane is used, if the target substance, and orientation of the surface plane of the target are changed, it is necessary for the angle between the target and substrate to be changed according to each target. For example, even when an Al alloy target is used as a target 4, if the target 4 is substantially oriented so as to have a (111) oriented surface plane, each substrate 7 may be positioned so that a line normal to each substrate 7 is relatively inclined from the surface of a target at an angle of 55°. That is to say, the surface of each substrate 7 is relatively inclined from the surface of the target 4 at an angle of 35°. Moreover, when a Ti target is used, if the target 4 is substantially oriented so as to have a (002) surface plane, each substrate 7 may be positioned in such a manner that a line normal to the surface of each substrate 7 is relatively inclined from the surface of the target at an angle of 55° (the surface of each substrate from the surface of the target at an angle of 35°).

Figure 6:
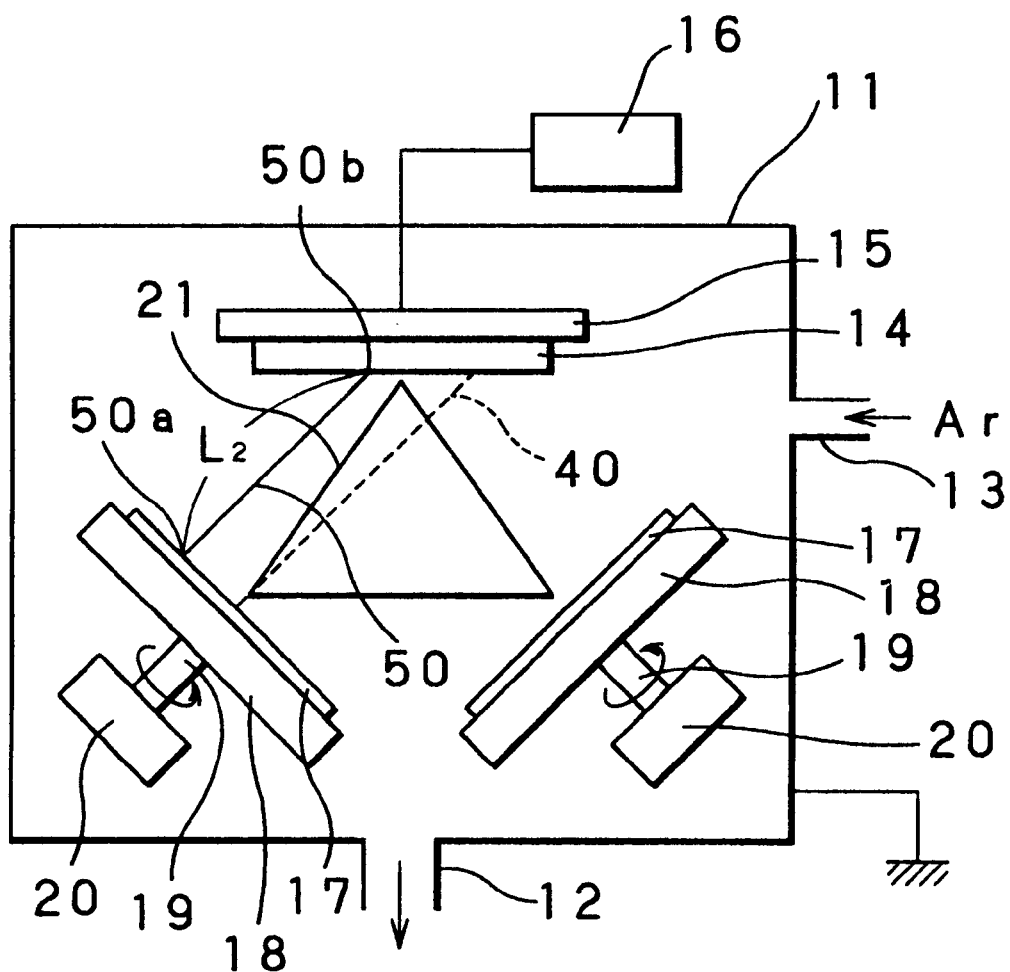
FIG. 6 is a typical view showing a sputtering apparatus according to a second embodiment of the present invention.

FIG. 6 is a typical view showing a sputtering apparatus according to a second embodiment of the present invention. Substrate holders 18 holding substrates 17 are placed in a chamber 11. Motors 20 are respectively mounted to the substrate holders 18 with interposing rotary shafts 19 therein and each substrate holder 18 is rotatable by a motor 20. In an upper space in the chamber 11, a target 14, a magnet (not shown) and a cathode electrode 15 fixedly held on the upper surface of the target 14 are placed. The cathode electrode 15 is connected with a direct current electric source 16 located outside the chamber 11.

A vacuum exhaust port 12 is formed at the bottom of the chamber 11 for the purpose of evacuating a gas from the interior of the chamber 11, a vacuum pump (not shown) is connected with the vacuum exhaust port 12. A gas inlet port 13 is formed at the side wall of the chamber 11 for introduction of an inert gas such as Ar gas or the like. That is, pressure in the chamber 11 can be adjusted so as to be a predetermined pressure by introducing the inert gas through the gas inlet port 13 into the chamber 11. A construction of the interior of the chamber 11 is like that in the first embodiment. As shown in the embodiment, when substrate holders 18 are arranged at respective two opposed positions, metal films can simultaneously be deposited on two substrates 17.

Each substrate 17 is placed in such a manner that the surface of each substrate 17 is perpendicular to a direction along which most particles are released from the target 14. However, in the second embodiment, a line 40 perpendicular to each substrate 17 which passes through the center thereof (normal to each substrate 17 at the center thereof) does not pass through the central portion of the target 14, but passes through a position spaced away from the central portion thereof. A line 50 passing through a first position 50a on the substrate 17 spaced apart from the center thereof by a length of a half radius thereof along a direction, in which it approaches the target 14, passes through a second position on the target 14 where the highest density of a plasma occurs and where the most particles are released from the target 14.

A shield plate (shield member) 21 is placed so as to cover a region below a line connecting between approximately the centers of the target 14 and each substrate 17. A region of the surface of each substrate 17 where a metal film is deposited is only one of the halves thereof nearer the target 14. However, since each substrate 17 is rotated by a motor 20, the metal film can be deposited across the entire surface of each substrate 17.

In the case of use of the sputtering apparatus thus constructed, the operation is similar to that shown in FIG. 4. In step S3, pressure in the chamber 11 is adjusted to a predetermined pressure by introducing Ar gas through the gas inlet port 13. In the second embodiment, the predetermined pressure is a pressure under which the mean free path of an Ar gas molecule is longer than a distance $L_2$. The distance $L_2$ is a distance between the first position 50a and the second position 50b where a line 50 perpendicular to each substrate 17 passes through the first position 50a intersects the surface of the target 14. And the distance $L_2$ is made longer than the radius of each substrate 17.

In the embodiment, too, since the angle between each substrate and the target 14, conditions of sputtering and the like are properly set, an effect similar to that in the first embodiment can be achieved. In the second embodiment, since a metal film is deposited on only one of the halves of each substrate 17, the situation is similar to a case where a metal film is deposited on a substrate having a diameter of one half of the diameter of the substrate 17. Therefore, without increase in a diameter of the target 14, a metal film having a uniform thickness is deposited across the surface of the substrate having a larger diameter. For example, even if a target 14 has the same diameter as that of a substrate 17, a more uniform metal film can be achieved.

What is claimed is:

1. A method of depositing a film on a substrate wherein a target having a planar surface and a substrate having a planar surface are placed in a chamber spaced a fixed distance from and inclined relative to one another with the planar surface of said substrate oriented substantially perpendicularly to a direction along which most particles are released from said target by sputtering, and a line perpendicular to the planar surface of said substrate passing through the center of said substrate substantially passes through the center of said target at a fixed angle dependent on the Miller index of the target material, said chamber is evacuated, a sputtering gas is introduced into said chamber, and particles are released from said target by sputtering while said substrate is rotated around an axis perpendicular to the surface of said substrate while being maintained at said fixed distance relative to said target.

2. A method of depositing a film according to claim 1, wherein said target is made of Al or an Al alloy which is substantially oriented so as to have a surface plane (100) thereof, and said substrate is placed so that an angle between the surface of said target from which said particles are released and the surface of said substrate is 45° substantially.

3. A method of depositing a film according to claim 1, wherein said target is made of Al or an Al alloy which is substantially oriented so as to have a surface plane (111) thereof, and said substrate is placed so that an angle between the surface of said target from which said particles are released and the surface of said substrate is 35° substantially.

4. A method of depositing a film according to claim 1, wherein said target is made of Ti which is substantially oriented so as to have a surface plane (002) thereof, and said substrate is placed so that an angle between the surface of said target from which said particles are released and the surface of said substrate is 35° substantially.

5. A method of depositing a film according to claim 1, wherein a distance between the center of said target and the center of said substrate is set longer than a diameter of said substrate.

6. A method of depositing a film according to claim 1, wherein the sputtering gas is introduced into the chamber at a pressure such that the mean free path of a molecule of said sputtering gas is longer than the distance between the center of said target and the center of said substrate.

7. A method of depositing a film on a substrate wherein a target having a planar surface and a substrate having a planar surface are placed in a chamber spaced a fixed distance from and inclined relative to one another with the planar surface of said substrate oriented substantially perpendicularly to a direction along which most particles are released from said target by sputtering, and a line perpendicular to the planar surface of said substrate passing through a first position on said substrate spaced along a direction in which said particles approach said target passes through a second position on said target, said chamber is evacuated, a sputtering gas is introduced into said chamber, and particles are released from said target by sputtering, while said substrate is rotated around an axis perpendicular to the planar surface of said substrate while being maintained at said fixed distance relative to said target, wherein said first position is a distance within one half the radius of said substrate; and, said line passes through said second position on said target at a fixed angle dependent on the Miller index of the target material spaced from a center of said target where plasma density is the highest and particle release the greatest.

8. A method of depositing a film according to claim 7, wherein said target is made of Al or an Al alloy which is substantially oriented so as to have a surface plane (100) thereof, and said substrate is placed so that an angle between the surface of said target from which said particles are released and the surface of said substrate is 45° substantially.

9. A method of depositing a film according to claim 7, wherein said target is made of Al or an Al alloy which is substantially oriented so as to have a surface plane (111) thereof, and said substrate is placed so that an angle between the surface of said target from which said particles are released and the surface of said substrate is 35° substantially.

10. A method of depositing a film according to claim 7, the improvement wherein said target is made of Ti which is substantially oriented so as to have a surface plane (002) thereof, and said substrate is placed so that an angle between the surface of said target from which said particles are released and the surface of said substrate is 35° substantially.

11. A method of depositing a film according to claim 7, wherein a distance between said first position on said substrate and said second position on said target is set to be longer than a radius of said substrate.

12. A method of depositing a film on a substrate according to claim 7, wherein said sputtering gas is introduced into said chamber at a pressure such that the mean free path of a molecule of said sputtering gas is longer than the distance between said first position on said substrate and said second position of said target.

13. A method according to claim 7, and further comprising providing a shield plate to cover half the surface of the target, the other half surface of the target having the first position located therein.

14. A sputtering apparatus comprising:
a chamber;
a gas inlet port for introducing a sputtering gas into said chamber;
a target having a planar surface for releasing particles by sputtering, positioned in said chamber;
a substrate holder having a planar surface for holding a substrate spaced a fixed distance from and inclined relative to said target with the planar surface of said substrate oriented substantially perpendicularly to a direction along which most particles are released from said target by sputtering, along a line perpendicular to the planar surface of said substrate passing through the center of said substrate substantially passes through the center of said target at a fixed angle dependent on the Miller index of the target material;
a rotator for rotating the substrate around an axis perpendicular to the planar surface of said substrate; and
a mass flow controller for controlling the flow of sputtering gas into the chamber.

15. A sputtering apparatus according to claim 14, wherein said target is made of Al or an Al alloy which is substantially oriented so as to have a surface plane (100) thereof, and said substrate is placed so that an angle between the surface of said target from which said particles are released and the surface of said substrate is 45° substantially.

16. A sputtering apparatus according to claim 14, wherein said target is made of Al or an Al alloy which is substantially oriented so as to have a surface plane (111) thereof, and said substrate is placed so that an angle between the surface of said target from which said particles are released and the surface of said substrate is 35° substantially.

17. A sputtering apparatus according to claim 14, wherein said target is made of Ti which is substantially oriented so as to have a surface plane (002) thereof, and said substrate is placed so that an angle between the surface of said target from which said particles are released and the surface of said substrate is 35° substantially.

18. A sputtering apparatus according to claim 14, wherein the distance between the center of said target and the center of said substrate is longer than a diameter of said substrate.

19. A method according to claim 14, wherein the sputtering gas is introduced into the chamber at a pressure such that the mean free path of a molecule of said sputtering gas is longer than the distance between the center of said target and the center of said substrate.

20. A sputtering apparatus comprising:
a chamber;
a gas inlet port for introducing a sputtering gas into said chamber;
a target having a planar surface for releasing particles by sputtering positioned in said chamber;
a substrate holder having a planar surface for holding a substrate spaced a fixed distance from and inclined relative to said target with the planar surface of said substrate oriented substantially perpendicularly to a direction along which most particles are released from said target by sputtering, along a line perpendicular to the planar surface of said substrate passing through a first position on said substrate spaced along a direction in which said particles approach said target passes through a second position on said target at a fixed angle dependent on the Miller index of the target material;
a rotator for rotating said substrate around an axis perpendicular to the planar surface of said substrate;
wherein said first position is a distance with one half the radius of said substrate and said line passes through said second position on said target spaced apart from a center of said target where plasma density is the highest and particle release the greatest;
said apparatus further comprises a mass flow controller for controlling the flow of sputtering gas into the chamber.

21. A sputtering apparatus according to claim 20, wherein said target is made of Al or an Al alloy which is substantially oriented so as to have a surface plane (100) thereof, and said substrate is placed so that an angle between the surface of said target from which said particles are released and the surface of said substrate is 45° substantially.

22. A sputtering apparatus according to claim 20, wherein said target is made of Al or an Al alloy which is substantially oriented so as to have a surface plane (111) thereof, and said substrate is placed so that an angle between the surface of said target from which said particles are released and the surface of said substrate is 35° substantially.

23. A sputtering apparatus according to claim 20, wherein said target is made of Ti which is substantially oriented so as to have a surface plane (002) thereof, and said substrate is placed so that an angle between the surface of said target from which said particles are released and the surface of said substrate is 35° substantially.

24. A sputtering apparatus according to claim 20, wherein the distance between said first position on said substrate and said second position on said target is longer than a radius of said substrate.

25. A sputtering apparatus according to claim 20, wherein said mass flow controller controls the flow of sputtering gas into the chamber such that the distance between said first position on said substrate and said second position on said target is shorter than mean free path of a molecule of said sputtering gas; and, further comprising a shield member placed between said target and substrate, shielding a farther side region from said target, which is one of two halves divided by a line down the center, in the surface of said substrate so that sputtered particles may not reach said farther side.

26. A sputtering apparatus according to claim 20, and further comprising a shield member placed so as to cover half the surface of said target, while leaving the other half of said target unshielded, with said first position located in said unshielded part.

* * * * *